United States Patent
Nosaka

(10) Patent No.: US 9,729,125 B2
(45) Date of Patent: Aug. 8, 2017

(54) FILTER APPARATUS COMPRISING SERIES CONNECTED LOW PASS AND HIGH PASS FILTERS WITH ACOUSTIC RESONATORS

(71) Applicant: Murata Manufacturing Co., Ltd., Nagaokakyo-shi, Kyoto-fu (JP)

(72) Inventor: Koji Nosaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 110 days.

(21) Appl. No.: 14/969,133

(22) Filed: Dec. 15, 2015

(65) Prior Publication Data
US 2016/0218696 A1    Jul. 28, 2016

(30) Foreign Application Priority Data
Jan. 23, 2015    (JP) ................................. 2015-011609

(51) Int. Cl.
*H03H 9/64* (2006.01)
*H03H 9/54* (2006.01)

(52) U.S. Cl.
CPC .......... *H03H 9/6423* (2013.01); *H03H 9/542* (2013.01); *H03H 9/6483* (2013.01)

(58) Field of Classification Search
CPC .......... H03H 9/54; H03H 9/542; H03H 9/568; H03H 9/605; H03H 9/64; H03H 9/6423; H03H 9/6483
(Continued)

(56) References Cited

U.S. PATENT DOCUMENTS 5,854,579 A *  12/1998  Penunuri ............. H03H 9/6483
                                                         310/313 B
6,404,302 B1 *  6/2002  Satoh .................. H03H 9/6483
                                                         333/193
(Continued)

FOREIGN PATENT DOCUMENTS

DE    10 2007 033 233 A1 *  1/2009
JP    2003-243966 A    8/2003
(Continued)

OTHER PUBLICATIONS

English language machine translation of JP 2011-234191 A, published Nov. 17, 2011, 14 pages.*
(Continued)

*Primary Examiner* — Barbara Summons
(74) *Attorney, Agent, or Firm* — Keating & Bennett, LLP

(57) ABSTRACT

A filter apparatus includes a low pass filter and a high pass filter connected in series to each other. The low pass filter includes first acoustic resonators including a resonant frequency and an anti-resonant frequency, first inductors, and first capacitive elements. The high pass filter includes second inductors, second capacitive elements, and second acoustic resonators. A first attenuation band caused by the anti-resonant frequency of the first acoustic resonators is provided at a low frequency side of a pass band and a second attenuation band caused by the resonant frequency of the second acoustic resonators is provided at a high frequency side of the pass band. A third attenuation band caused by a first LC resonant circuit is provided at a low frequency side of the first attenuation band and a fourth attenuation band caused by a second LC resonant circuit is provided at a high frequency side of the second attenuation band.

19 Claims, 9 Drawing Sheets

(58) Field of Classification Search
USPC ........................................ 333/189, 193, 195
See application file for complete search history.

(56) References Cited

U.S. PATENT DOCUMENTS

| | | | | |
|---|---|---|---|---|
| 7,880,566 | B2* | 2/2011 | Wada | .................. H03H 9/009 |
| | | | | 333/190 |
| 8,648,672 | B2* | 2/2014 | Onzuka | ................. H03H 7/075 |
| | | | | 333/176 |
| 8,773,221 | B2* | 7/2014 | Nakahashi | ......... H03H 9/14594 |
| | | | | 333/193 |
| 2004/0051601 | A1 | 3/2004 | Frank | |
| 2004/0246077 | A1* | 12/2004 | Misu | ................... H03H 7/0115 |
| | | | | 333/195 |
| 2005/0099244 | A1* | 5/2005 | Nakamura | ......... H03H 9/02118 |
| | | | | 333/133 |
| 2007/0030096 | A1 | 2/2007 | Nishihara et al. | |
| 2007/0159274 | A1* | 7/2007 | Onzuka | ............... H03H 9/6483 |
| | | | | 333/193 |
| 2008/0303379 | A1 | 12/2008 | Nakai et al. | |
| 2010/0188166 | A1 | 7/2010 | Hara et al. | |
| 2012/0286896 | A1 | 11/2012 | Takamine | |
| 2014/0113580 | A1 | 4/2014 | Yamazaki | |

FOREIGN PATENT DOCUMENTS

| | | |
|---|---|---|
| JP | 2004-104799 A | 4/2004 |
| JP | 2006-086871 A | 3/2006 |
| JP | 2011-234191 A | 11/2011 |
| JP | 2012-257050 A | 12/2012 |
| KR | 10-2007-0017926 A | 2/2007 |
| KR | 10-2010-0087617 A | 8/2010 |
| KR | 10-2012-0094522 A | 8/2012 |
| WO | 2007/023643 A1 | 3/2007 |
| WO | 2007/097186 A1 | 8/2007 |
| WO | 2012/176508 A1 | 12/2012 |

OTHER PUBLICATIONS

K. Ibata et al.; "An m-Derived Ladder High Pass SAW Filter"; 2003 IEEE Ultrasonics Symposium, 2003, pp. 397-400.*
Official Communication issued in corresponding Japanese Patent Application No. 2015-011609, mailed on Jan. 17, 2017.

* cited by examiner

FILTER APPARATUS COMPRISING SERIES CONNECTED LOW PASS AND HIGH PASS FILTERS WITH ACOUSTIC RESONATORS

BACKGROUND OF THE INVENTION

1. Field of the Invention

The present invention relates to a filter apparatus including at least one pass band and multiple attenuation bands.

2. Description of the Related Art

In a filter apparatus described in Japanese Unexamined Patent Application Publication No. 2012-257050, a surface acoustic wave (SAW) resonator is combined with an LC filter. The SAW resonator provides a trap.

International Publication No. WO 2007/097186 discloses a surface acoustic wave apparatus using a piezoelectric layer made of $LiNbO_3$. It is indicated that a higher order mode of shear horizontal (SH) waves appear in the pass band as a spurious in the surface acoustic wave apparatus using the piezoelectric layer made of $LiNbO_3$. Accordingly, an increase in loss occurs.

When it is necessary to provide traps in two frequency bands using the SAW resonator, for example, as described in Japanese Unexamined Patent Application Publication No. 2012-257050, it is necessary for a trap circuit to be cascade-connected. Accordingly, the loss is increased and the size of the filter apparatus is liable to be increased.

On the other hand, as described in International Publication No. WO2007/097186, the higher order mode of the SH waves has been known to be the spurious causing the increase in loss. Accordingly, it is considered that the higher order mode of the SH waves should be suppressed.

SUMMARY OF THE INVENTION

Accordingly, preferred embodiments of the present invention provide a filter apparatus in which a lumped-parameter element is combined with an acoustic resonator and which is capable of simplifying its circuit configuration, decreasing its size, and reducing the loss.

According to a preferred embodiment of the present invention, a filter apparatus includes an input terminal; an output terminal; a low pass filter connected between the input terminal and the output terminal; and a high pass filter connected in series to the low pass filter between the input terminal and the output terminal. The low pass filter includes a first acoustic resonator that is provided on a signal line connecting the input terminal to the output terminal and that has a resonant frequency and an anti-resonant frequency; a first inductor connected between the signal line and ground potential; and a first capacitive element that is connected in series to the first inductor and that defines a first LC resonant circuit with the first inductor. The high pass filter includes a second inductor provided on the signal line; a second capacitive element that is connected in parallel to the second inductor and that defines a second LC resonant circuit with the second inductor; and a second acoustic resonator that is connected between the signal line and the ground potential and that has a resonant frequency and an anti-resonant frequency. A first attenuation band caused by the anti-resonant frequency of the first acoustic resonator is provided at low frequency side of a pass band and a second attenuation band caused by the resonant frequency of the second acoustic resonator is provided at high frequency side of the pass band. A third attenuation band caused by a resonant frequency of the first LC resonant circuit is provided at low frequency side of the first attenuation band and a fourth attenuation band caused by a resonant frequency of the second LC resonant circuit is provided at high frequency side of the second attenuation band.

In the filter apparatus, a second pass band may be provided between the first attenuation band and the third attenuation band. In this case, it is possible to provide the filter apparatus having the second pass band, in addition to the first pass band.

In the filter apparatus, a third pass band may be provided between the second attenuation band and the fourth attenuation band. In this case, it is possible to provide the filter apparatus further including the third pass band.

In the filter apparatus, the first acoustic resonator may be an elastic wave resonator.

In the filter apparatus, the first acoustic resonator may be a surface acoustic wave resonator including a piezoelectric layer made of $LiNbO_3$ and an IDT electrode provided on one surface of the piezoelectric layer. In this case, it is possible to reduce (because the capacitance has a high Q value) the loss at high frequency side of the anti-resonant frequency.

In the filter apparatus, a response of SH waves from the elastic wave resonator may be positioned in the first attenuation band. In this case, it is possible to effectively increase the attenuation in a trap including the first acoustic resonator. In addition, it is possible to increase the width of the attenuation bands. Furthermore, it is possible to increase the attenuation without increasing the number of circuits and resonators.

In the filter apparatus, a spurious caused by a harmonic of the SH waves of the elastic wave resonator may be positioned in the second attenuation band. In this case, it is possible to more effectively increase the attenuation of the second attenuation band using the spurious caused by the harmonic of the SH waves. In other words, it is possible to improve the attenuation characteristics of the second attenuation band using the harmonic of the SH waves, which has not been required.

In the filter apparatus, the second acoustic resonator may be an elastic wave resonator.

In the filter apparatus, the second acoustic resonator may be a surface acoustic wave resonator including a piezoelectric layer made of $LiTaO_3$ and an IDT electrode provided on one surface of the piezoelectric layer. In this case, since $LiTaO_3$ is cheaper than $LiNbO_3$, the cost of the filter apparatus is reduced. In addition, the spurious is significantly reduced and the loss is small at low frequency side of the resonant frequency in the surface acoustic wave resonator using $LiTaO_3$. Accordingly, stable capacitance characteristics are achieved thus further reducing the loss.

According to the preferred embodiments of the present invention, it is possible to achieve reduction in loss, reduction in size, and simplification of the circuit configuration in the filter apparatus including the four attenuation bands.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Example preferred embodiments of the present invention will herein be described with reference to the attached drawings.

The preferred embodiments described in this specification are only examples. It is noted that partial replacement or combination of components in different preferred embodiments is applicable and within the scope of the present invention.

Figure 1:
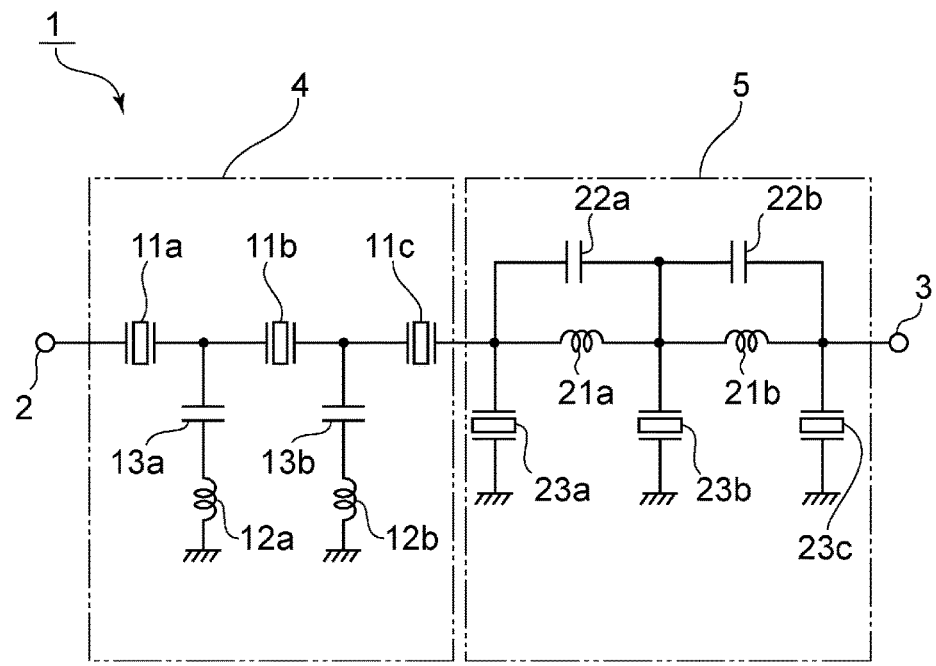
FIG. 1 is a circuit diagram of a filter apparatus according to a first preferred embodiment of the present invention.

FIG. 1 is a circuit diagram of a filter apparatus according to a first preferred embodiment of the present invention.

Referring to FIG. 1, a filter apparatus 1 is provided with an input terminal 2 and an output terminal 3. A low pass filter 4 and a high pass filter 5 are connected in series between the input terminal 2 and the output terminal 3.

The low pass filter 4 includes first acoustic resonators 11a, 11b, and 11c provided on a signal line connecting the input terminal 2 to the output terminal 3. The first acoustic resonators 11a, 11b, and 11c are acoustic resonators including a resonant frequency and an anti-resonant frequency. In the first preferred embodiment, the first acoustic resonators 11a, 11b, and 11c preferably are surface acoustic wave resonators.

In the low pass filter 4, a first inductor 12a is connected between a node between the first acoustic resonator 11a and the first acoustic resonator 11b and ground potential. A first capacitive element 13a is connected in series to the first inductor 12a. A first inductor 12b and a first capacitive element 13b are connected also between a node between the first acoustic resonator 11b and the first acoustic resonator 11c and the ground potential.

In contrast, the high pass filter 5 includes second inductors 21a and 21b provided on the signal line. Second capacitive elements 22a and 22b are connected in parallel to the second inductors 21a and 21b.

In the high pass filter 5, second acoustic resonators 23a, 23b, and 23c are provided between the signal line and the ground potential. More specifically, the second acoustic resonator 23a is connected between an input terminal side of the second inductor 21a and the ground potential. The second acoustic resonator 23b is connected between a node between the second inductor 21a and the second inductor 21b and the ground potential. The second acoustic resonator 23c is connected between an output terminal side of the second inductor 21b and the ground potential. The second acoustic resonators 23a, 23b, and 23c are acoustic resonators including a resonant frequency and an anti-resonant frequency. In the first preferred embodiment, the second acoustic resonators 23a, 23b, and 23c preferably are surface acoustic wave resonators.

Figure 2:
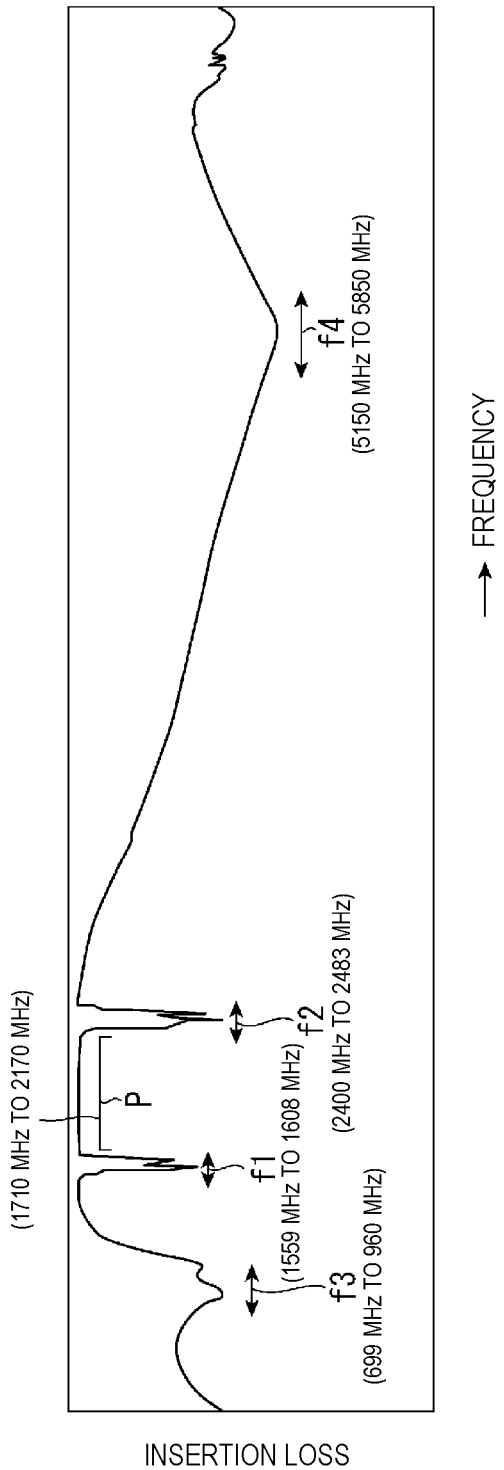
FIG. 2 illustrates filter characteristics of the filter apparatus of the first preferred embodiment of the present invention.

FIG. 2 illustrates filter characteristics of the filter apparatus 1 of the first preferred embodiment. As illustrated in FIG. 2, first to fourth attenuation bands f1 to f4 are provided. Specifically, the first attenuation band f1 is provided at low frequency side of a pass band P and the second attenuation band f2 is provided at high frequency side of the pass band P. The third attenuation band f3 is provided at low frequency side of the first attenuation band f1. The fourth attenuation band f4 is provided at a high frequency side of the second attenuation band f2. In the filter apparatus 1, the first to fourth attenuation bands f1 to f4 are provided in the circuit configuration described above.

More specifically, the anti-resonant frequency of the first acoustic resonators 11a, 11b, and 11c is positioned in the first attenuation band f1. This ensures the attenuation in the first attenuation band f1.

The resonant frequency of the second acoustic resonators 23a, 23b, and 23c is positioned in the second attenuation band f2. In other words, the second acoustic resonators 23a, 23b, and 23c make the attenuation in the second attenuation band f2 sufficiently large.

The resonant frequency of an LC resonant circuit including the first inductors 12a and 12b and the first capacitive elements 13a and 13b is positioned in the third attenuation band f3.

The resonant frequency of an LC resonant circuit including the second inductors 21a and 21b and the second capacitive elements 22a and 22b is positioned in the fourth attenuation band f4. Accordingly, the pass band is provided between the first attenuation band f1 and the second attenuation band f2 and the first to fourth attenuation bands f1 to f4 are provided in the manner described above.

The attenuation of the second attenuation band f2 is further increased by using the higher order mode of the SH waves in the first acoustic resonators 11a, 11b, and 11c in the first preferred embodiment. This will be described in detail below.

Figure 3:
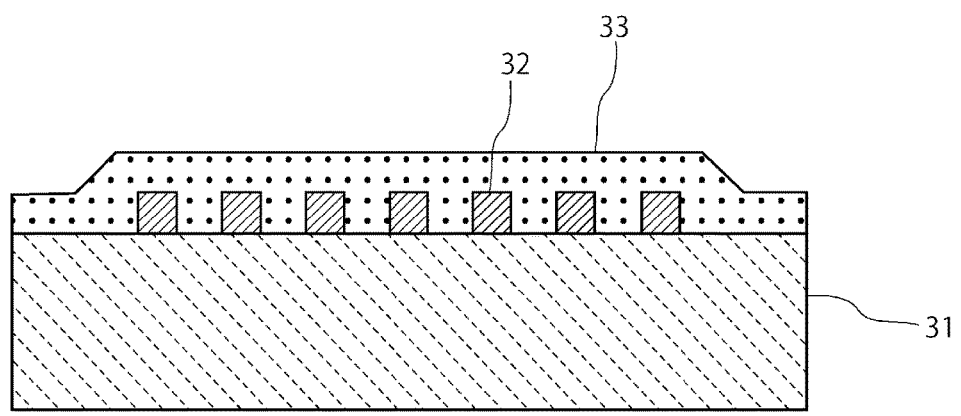
FIG. 3 is a schematic front cross-sectional view of a surface acoustic wave resonator, which is a first acoustic resonator and which includes a piezoelectric layer made of LiNbO$_3$.

FIG. 3 is a schematic front cross-sectional view of the first acoustic resonator 11a. The first acoustic resonator 11a includes a piezoelectric layer 31 and interdigital transducer (IDT) electrodes 32 provided on one side of the piezoelectric layer 31. The piezoelectric layer 31 is made of LiNbO$_3$. Although not specifically illustrated, reflectors are provided on both ends of each of the IDT electrodes 32 in the propagation direction of the surface acoustic waves. This provides a surface acoustic wave resonator including one input and one output. A SiO$_2$ film 33 is provided so that the IDT electrodes 32 are covered with the SiO$_2$ film 33. The SiO$_2$ film 33 protects the IDT electrodes 32.

The first acoustic resonators 11b and 11c are preferably configured in the same manner as in the first acoustic resonator 11a.

Figure 5:
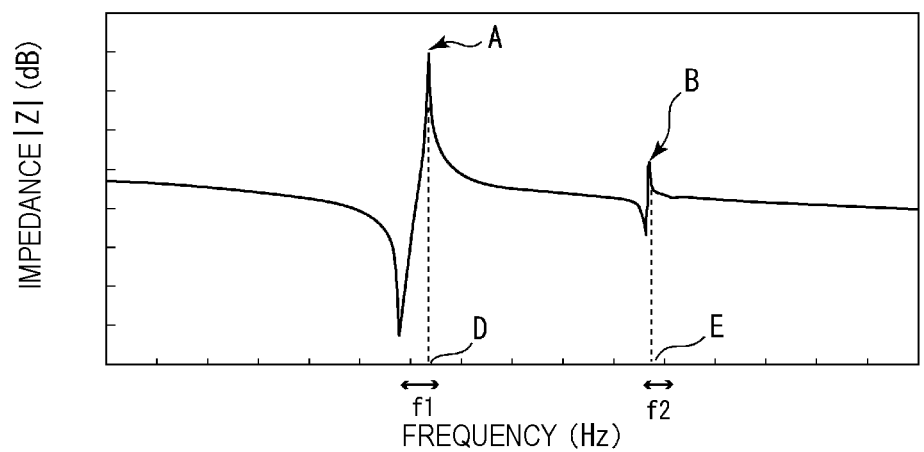
FIG. 5 illustrates impedance-frequency characteristics of the surface acoustic wave resonator, which is the first acoustic resonator and which includes the piezoelectric layer made of LiNbO$_3$ in the first preferred embodiment of the present invention.

FIG. 5 illustrates impedance-frequency characteristics of the first acoustic resonator 11a. Since the piezoelectric layer 31 made of LiNbO$_3$ is provided, a response in the higher order mode of the SH waves, which is indicated by an arrow B, appears in addition to a response in a basic mode of the SH waves, which is indicated by an arrow A. Varying the thickness of the SiO$_2$ film 33 shifts the frequency of the higher order of the SH waves indicated by the arrow B.

The first attenuation band f1 described above is provided by using the impedance value of the anti-resonant frequency of the basic mode of the first acoustic resonator 11a. In contrast, since the higher order mode of the SH waves indicated by the arrow B appear as the spurious in a typical elastic wave filter in related art, as illustrated in International Publication No. WO2007/097186, the higher order mode of the SH waves is intended to be suppressed.

In contrast, in the first preferred embodiment, the higher order mode of the SH waves indicated by the arrow B is positioned in the second attenuation band f2. Accordingly, the attenuation of the elastic wave filter is increased not only by the attenuation of the elastic wave filter caused by the impedance of the second acoustic resonators 23a, 23b, and 23c at the resonant frequency of the second acoustic resonators 23a, 23b, and 23c but also by the responses in the higher order mode of the SH waves from the first acoustic resonators 11a, 11b, and 11c.

Since the use of the higher order mode of the SH waves facilitates the increase in the attenuation, the attenuation is increased without increasing the order of the circuit and the number of the resonators. Accordingly, it is possible to facilitate the decrease in size and the reduction in loss.

The frequency characteristics in the first acoustic resonators 11a, 11b, and 11c are capable of being adjusted using the material and the film thickness of the IDT electrodes. In other words, the frequency spacing between the basic mode and the higher order mode of the SH waves are also capable of being adjusted using the material and the film thickness of the IDT electrodes. In addition, a dielectric layer made of SiO$_2$ or the like may be provided on the piezoelectric layer 31. In this case, the magnitude or the like of the level of the higher order mode is capable of being adjusted using the film thickness of the dielectric layer. Specifically, the level of the higher order mode is increased with the increasing thickness of the dielectric layer. Accordingly, as illustrated in FIG. 5, the basic mode and the higher order mode of the SH waves may be positioned in the first and second attenuation bands f1 and f2, respectively.

Figure 4:
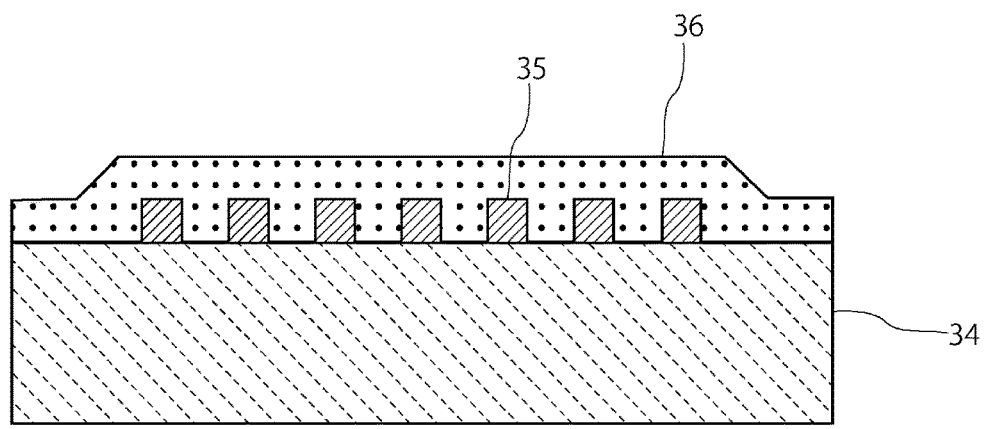
FIG. 4 is a schematic front cross-sectional view of a surface acoustic wave resonator, which is a second acoustic resonator and which includes a piezoelectric layer made of LiTaO$_3$.

FIG. 4 is a schematic front cross-sectional view illustrating the second acoustic resonator 23a. The second acoustic resonators 23b and 23c are preferably configured in the same manner as in the second acoustic resonator 23a.

As illustrated in FIG. 4, IDT electrodes 35 are provided on a piezoelectric layer 34. The piezoelectric layer 34 is made of LiTaO$_3$. A SiO$_2$ film 36 is provided so that the IDT electrodes 35 are covered with the SiO$_2$ film 36.

Figure 6:
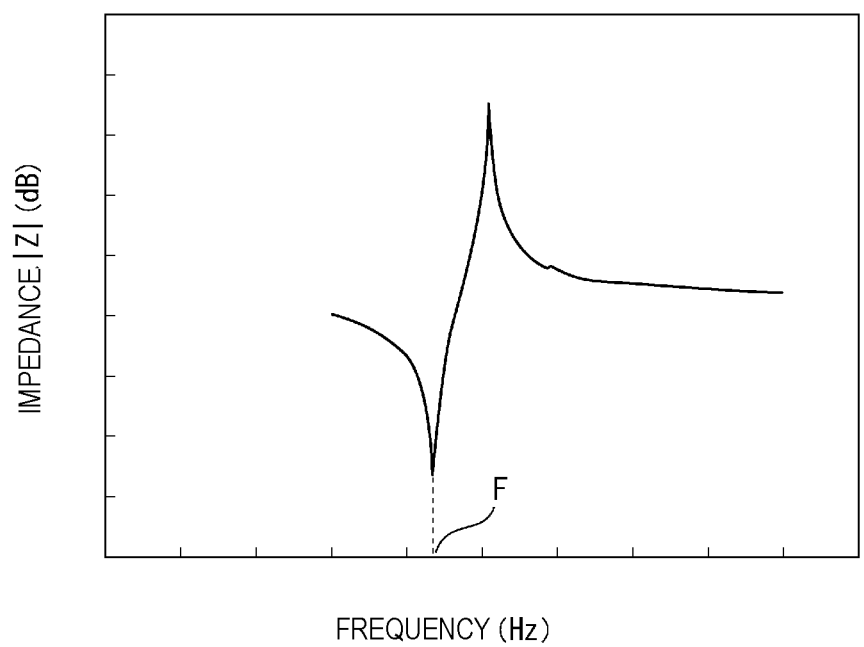
FIG. 6 illustrates impedance-frequency characteristics of the surface acoustic wave resonator, which is the second acoustic resonator and which includes the piezoelectric layer made of LiTaO$_3$ in the first preferred embodiment of the present invention.

FIG. 6 illustrates impedance-frequency characteristics of the second acoustic resonator 23a using the piezoelectric layer made of LiTaO$_3$. As apparent from FIG. 6, although the response of the basic mode of the SH waves appears in the second acoustic resonator 23a using the piezoelectric layer made of LiTaO$_3$, the response in the higher order mode is not observed in the second acoustic resonator 23a. The resonant frequency of the second acoustic resonator 23a defines the second attenuation band f2, as described above.

The relationship between impedance-frequency characteristics of the first acoustic resonators 11a, 11b, and 11c and the second acoustic resonators 23a, 23b, and 23c and the filter characteristics described above will now be described with reference to FIG. 7.

Figure 7:
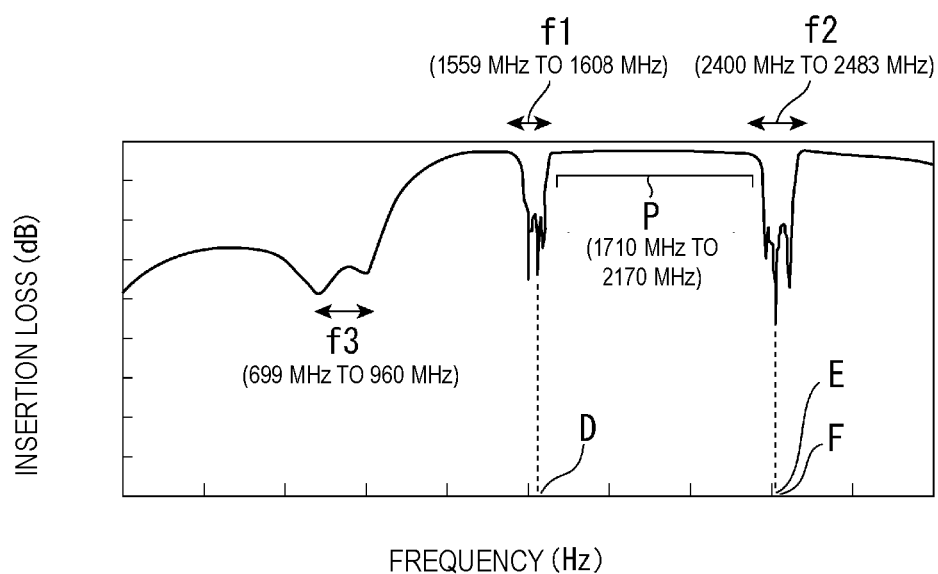
FIG. 7 illustrates the relationship between resonant frequencies or anti-resonant frequencies of the first and second acoustic resonators and attenuation bands in the filter characteristics of the first preferred embodiment of the present invention.

Referring to FIG. 7, D-E corresponds to a frequency band indicated by D-E in FIG. 5. Specifically, D indicates the position of the anti-resonant frequency. E indicates the position of the anti-resonant frequency in the higher order mode of the SH waves.

F in FIG. 7 indicates the frequency position of F in FIG. 6. In the other words, F indicates the position of the resonant frequency of the second acoustic resonator 23a.

As apparent from FIG. 7, the first acoustic resonators 11a, 11b, and 11c define the first attenuation band f1. The second attenuation band f2 is realized by the impedance of the resonant frequency of the second acoustic resonator 23a and the impedance of the anti-resonant frequency in the higher order mode of the SH waves of the first acoustic resonator 11a illustrated in FIG. 5.

Accordingly, the filter apparatus 1 of the first preferred embodiment is preferably used as a filter for a cellular phone using, for example, a cellular middle band (about 1,710 MHz to about 2,170 MHz) as the pass band. A global positioning system (GPS) band (about 1,559 MHz to about 1,608 MHz) is positioned at low frequency side directly next to the cellular middle band and an Industrial, Scientific and Medical (ISM) 2.4-GHz band (about 2,400 MHz to about 2,483 MHz) exists at high frequency side directly next to the cellular middle band. A cellular low band (about 699 MHz to about 960 MHz) exists at low frequency side of the GPS band and a wireless local area network (WLAN) (IEEE802.11a) communication band (about 5,150 MHz to about 5,850 MHz) exists at high frequency side of the ISM 2.4-GHz band. In the filter apparatus 1, the first attenuation band f1 and the second attenuation band f2 define a trap of the GPS band and a trap that attenuates the signals in the ISM 2.4-GHz band. The third attenuation band f3 and the fourth attenuation band f4 cause the cellular low band and the WLAN band to be used as the attenuation bands.

Figure 8:
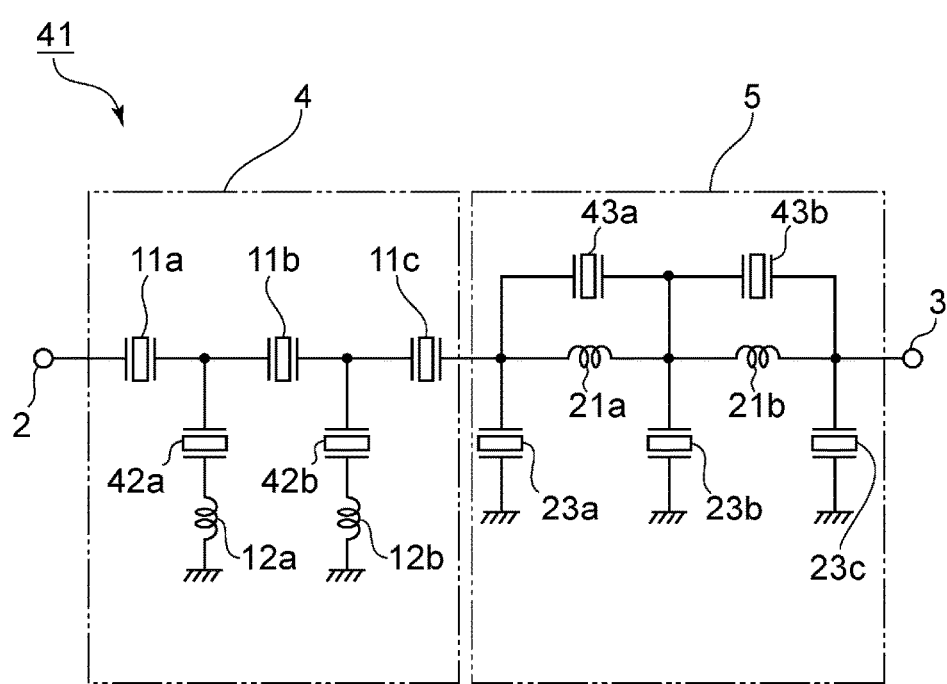
FIG. 8 is a circuit diagram illustrating a filter apparatus according to a second preferred embodiment of the present invention.

FIG. 8 is a circuit diagram illustrating a filter apparatus 41 of a second preferred embodiment of the present invention. In the filter apparatus 41, acoustic resonators 42a and 42b are used in the low pass filter 4, instead of the first capacitive elements 13a and 13b. Acoustic resonators 43a and 43b are used in the high pass filter 5, instead of the second capacitive elements 22a and 22b. The remaining configuration of the filter apparatus 41 of the second preferred embodiment is the same as that of the filter apparatus 1 of the first preferred embodiment. Accordingly, the same reference numerals are used in the second preferred embodiment to identify the same components in the first preferred embodiment and the description of the first preferred embodiment is incorporated by reference.

The acoustic resonators 42a and 42b are acoustic resonators including a resonant frequency and an anti-resonant frequency. The acoustic resonators 42a and 42b are used as the first capacitive elements using the capacitance of the acoustic resonators 42a and 42b in a frequency band other than the resonant frequency and the anti-resonant frequency. The resonant frequency of a first LC resonant circuit including the capacitance of the acoustic resonators 42a and 42b and the first inductors 12a and 12b defines the third attenuation band f3. The resonant frequency of the acoustic resonators 42a and 42b is positioned in the second attenuation band f2, as in the second acoustic resonators 23a, 23b, and 23c. Accordingly, the attenuation in the second attenuation band f2 is capable of being further increased.

Similarly, the anti-resonant frequency of the acoustic resonators 43a and 43b, which are the second capacitive elements, is positioned in the first attenuation band f1, as in the first acoustic resonators 11a, 11b, and 11c. Accordingly, the attenuation in the first attenuation band f1 is capable of being further increased.

The resonant frequency of an LC resonant circuit including the capacitance of the acoustic resonators 43a and 43b and the second inductors 21a and 21b is positioned in the fourth attenuation band f4.

As in the filter apparatus 41, the first and second capacitive elements may be acoustic resonators having the resonant frequencies and the anti-resonant frequencies. This allows the attenuation in the attenuation bands to be further increased, as described above. In order to simplify the element structure, the first and second capacitive elements preferably are capacitors, instead of the resonators.

In the filter apparatus 1, the first acoustic resonators 11a, 11b, and 11c are preferably made of $LiNbO_3$ and the second acoustic resonators 23a, 23b, and 23c are preferably made of $LiTaO_3$. However, the present invention is not limited to this combination. Specifically, if the appearance of the higher order mode of the SH waves is permitted in the second acoustic resonators 23a, 23b, and 23c, the second acoustic resonators 23a, 23b, and 23c may be made of $LiNbO_3$. In this case, the first acoustic resonators 11a, 11b, and 11c and the second acoustic resonators 23a, 23b, and 23c may be made of $LiNbO_3$.

Each of the first acoustic resonators 11a, 11b, and 11c may include the piezoelectric layer made of $LiTaO_3$. In this case, the attenuation caused by the SH waves is not increased. All of the first acoustic resonators 11a, 11b, and 11c and the second acoustic resonators 23a, 23b, and 23c may be include a single piezoelectric layer.

When $LiTaO_3$ is used as the material of the piezoelectric layer, the cost of the filter apparatus is capable of being reduced because the filter apparatus using $LiTaO_3$ as the material of the piezoelectric layer is cheaper than the filter apparatus using $LiNbO_3$ as the material of the piezoelectric layer. In addition, the spurious is significantly reduced at low frequency side of the resonant frequency of the first acoustic resonators 11a, 11b, and 11c provided on the piezoelectric layer made of $LiTaO_3$. Accordingly, relatively stable capacitance characteristics are achieved, thus reducing the loss of the filter apparatus 1.

Although the first acoustic resonators 11a, 11b, and 11c and the second acoustic resonators 23a, 23b, and 23c are used in the first and second preferred embodiments, the number of the first acoustic resonators and the second acoustic resonators are not specifically limited. Similarly, the number of the first inductors 12a and 12b, the first capacitive elements 13a and 13b, the second inductors 21a and 21b, and the second capacitive elements 22a and 22b are not specifically limited.

Elastic wave resonators other than the surface acoustic wave resonators may be used as the first acoustic resonators 11a, 11b, and 11c and the second acoustic resonators 23a, 23b, and 23c. For example, boundary acoustic wave resonators may be used. Alternatively, piezoelectric thin film resonators using bulk waves may be used. The bulk waves propagate in a piezoelectric thin film in which a thin piezoelectric layer is provided on a portion of a carrier, such as a silicon wafer. Alternatively, various piezoelectric resonators including a single plate type piezoelectric resonator or a multilayer piezoelectric resonator may be used.

Figure 9:
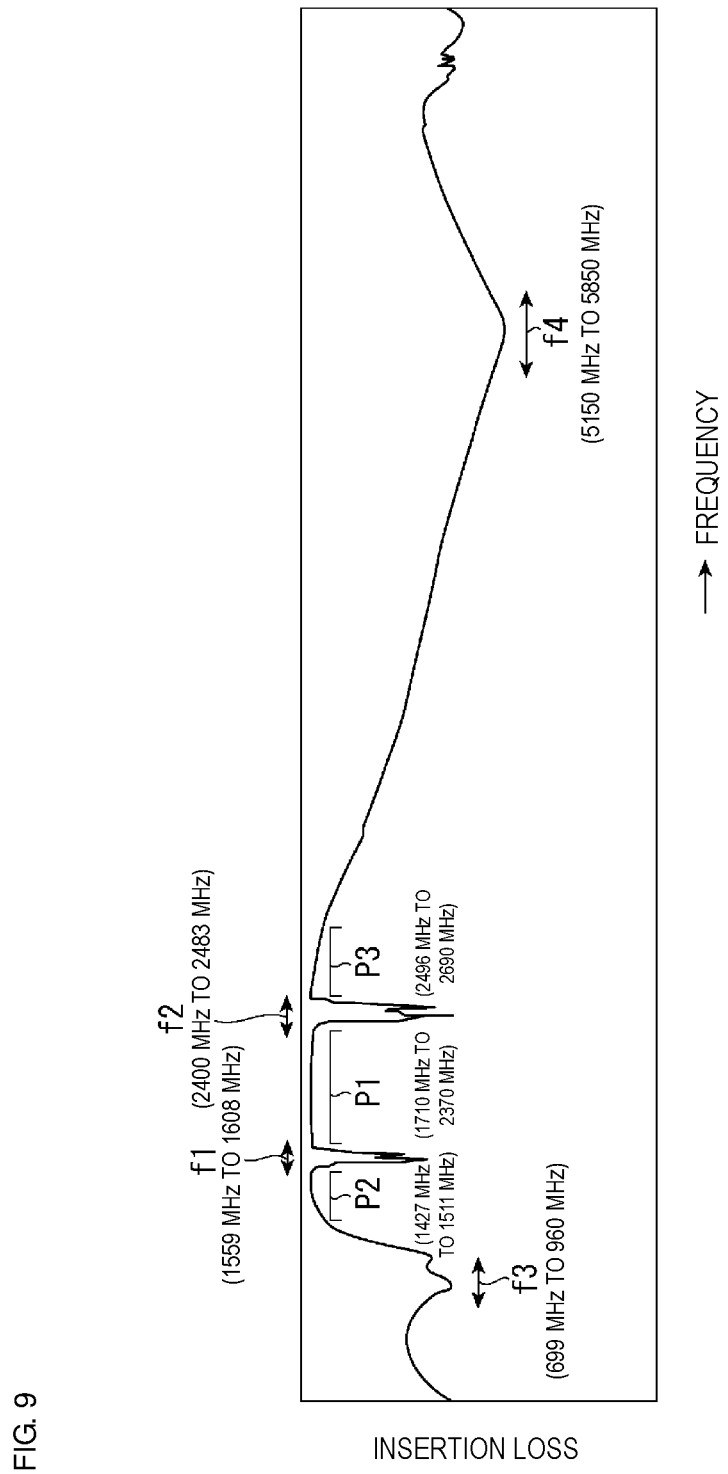
FIG. 9 illustrates filter characteristics of a filter apparatus according to a third preferred embodiment of the present invention.

Although one pass band and the four attenuation bands f1 to f4 are preferably provided in the filter apparatus 1, first to third pass bands P1 to P3 may be provided, as in filter characteristics of a filter apparatus of a third preferred embodiment, illustrated in FIG. 9. Specifically, the second pass band P2 may be provided between the first attenuation band f1 and the third attenuation band f3 and the first pass band P1 may be provided between the first attenuation band f1 and the second attenuation band f2. In addition, the third pass band P3 may be provided at high frequency side of the second attenuation band f2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter apparatus comprising:
   an input terminal;
   an output terminal;
   a low pass filter connected between the input terminal and the output terminal; and
   a high pass filter connected in series to the low pass filter between the input terminal and the output terminal;
   wherein
   the low pass filter includes:
      a first acoustic resonator that is provided on a signal line connecting the input terminal to the output terminal and that includes a resonant frequency and an anti-resonant frequency;
      a first inductor connected between the signal line and ground potential; and
      a first capacitive element that is connected in series to the first inductor and that defines a first LC resonant circuit with the first inductor; wherein
   the high pass filter includes:
      a second inductor provided on the signal line;
      a second capacitive element that is connected in parallel to the second inductor and that defines a second LC resonant circuit with the second inductor; and
      a second acoustic resonator that is connected between the signal line and the ground potential and that includes a resonant frequency and an anti-resonant frequency; wherein
   a first attenuation band caused by the anti-resonant frequency of the first acoustic resonator is provided at a low frequency side of a pass band and a second attenuation band caused by the resonant frequency of the second acoustic resonator is provided at a high frequency side of the pass band;
   a third attenuation band caused by a resonant frequency of the first LC resonant circuit is provided at a low frequency side of the first attenuation band; and
   a fourth attenuation band caused by a resonant frequency of the second LC resonant circuit is provided at a high frequency side of the second attenuation band.

2. The filter apparatus according to claim 1, wherein a second pass band is provided between the first attenuation band and the third attenuation band.

3. The filter apparatus according to claim 1, wherein a third pass band is provided between the second attenuation band and the fourth attenuation band.

4. The filter apparatus according to claim 1, wherein the first acoustic resonator is an elastic wave resonator.

5. The filter apparatus according to claim 4, wherein the first acoustic resonator is a surface acoustic wave resonator including a piezoelectric layer made of $LiNbO_3$ and an IDT electrode provided on one surface of the piezoelectric layer.

6. The filter apparatus according to claim 5, wherein a response of shear horizontal waves from the elastic wave resonator is positioned in the first attenuation band.

7. The filter apparatus according to claim 5, wherein a spurious caused by a harmonic of shear horizontal waves of the elastic wave resonator is positioned in the second attenuation band.

8. The filter apparatus according to claim 5, wherein a $SiO_2$ film is provided on the IDT electrode.

9. The filter apparatus according to claim 5, wherein a higher order mode of shear horizontal waves of the elastic wave resonator is positioned in the second attenuation band.

10. The filter apparatus according to claim 4, wherein the first acoustic resonator is one of a surface acoustic wave resonator, a boundary acoustic wave resonator, and a piezoelectric resonator.

11. The filter apparatus according to claim 1, wherein the second acoustic resonator is an elastic wave resonator.

12. The filter apparatus according to claim 11, wherein the second acoustic resonator is a surface acoustic wave resonator including a piezoelectric layer made of $LiTaO_3$ and an IDT electrode provided on one surface of the piezoelectric layer.

13. The filter apparatus according to claim 12, wherein a $SiO_2$ film is provided on the IDT electrode.

14. The filter apparatus according to claim 11 wherein the second acoustic resonator is one of a surface acoustic wave resonator, a boundary acoustic wave resonator, and a piezoelectric resonator.

15. The filter apparatus according to claim 1, wherein the low pass filter includes a plurality of the first acoustic resonators.

16. The filter apparatus according to claim 1, wherein the high pass filter includes a plurality of the second acoustic resonators.

17. The filter apparatus according to claim 1, wherein each of the first capacitive element and the second capacitive element includes acoustic resonators.

18. The filter apparatus according to claim 1, wherein a first pass band is provided between the first attenuation band and the second attenuation band, and a second pass band is provided between the first attenuation band and the third attenuation band.

19. A cellular phone comprising the filter apparatus of claim 1.

* * * * *